United States Patent [19]

Okajima

[11] Patent Number: 5,083,294
[45] Date of Patent: Jan. 21, 1992

[54] SEMICONDUCTOR MEMORY DEVICE HAVING A REDUNDANCY

[75] Inventor: Yoshinori Okajima, Kanagawa, Japan

[73] Assignee: Fujitsu Limited, Kawasaki, Japan

[21] Appl. No.: 562,512

[22] Filed: Aug. 3, 1990

[30] Foreign Application Priority Data

Aug. 4, 1989 [JP] Japan .................................. 1-203001

[51] Int. Cl.$^5$ ................................................ G11C 7/00
[52] U.S. Cl. .................................... 365/200; 365/210; 365/230.03
[58] Field of Search ................... 365/200, 210, 230.03; 371/10.1, 10.3

[56] References Cited

U.S. PATENT DOCUMENTS 4,918,662 4/1990 Kondo .................................. 365/210

Primary Examiner—Joseph A. Popek
Attorney, Agent, or Firm—Armstrong, Nikaido, Marmelstein, Kubovcik & Murray

[57] ABSTRACT

A semiconductor memory device having a plurality of main memory cell arrays, a redundant memory cell array, a plurality of word lines provided in each of the main memory cell arrays and the redundant memory cell array, a plurality of bit lines, a plurality of common word lines extending throughout the plurality of main memory cell arrays and the redundant memory cell array, a row decoder for addressing a common word line in response to first address data, a plurality of word line switches for selectively connecting the common word line to a corresponding word line, and a column decoder supplied with second address data for addressing a bit line in a main memory cell. The column decoder has a controller for selectively disabling the addressing of bit line in response to incoming of a particular combination of the second address data to the column decoder. A redundant column decoder is included which is supplied with second address data for selectively addressing a bit line in response to incoming of particular combination of the second address data. The word line switches for the redundant memory cell array are controlled such that the common word lines are connected to corresponding word lines of the redundant memory cell array irrespective of the first and second address data.

8 Claims, 10 Drawing Sheets

SEMICONDUCTOR MEMORY DEVICE HAVING A REDUNDANCY

BACKGROUND OF THE INVENTION

The present invention generally relates to semiconductor memory devices and more particularly to a semiconductor memory device having a redundant construction.

With increasing storage capacity of semiconductor memory devices, fabrication of memory devices which are entirely free from the defective memory cell is becoming increasingly difficult. Particularly, in the case of the memory cells fabricated with a newly developed process, there is a tendency that a number of defects are involved. When the memory devices which contain defect are rejected entirely, the yield of production of the memory device is seriously decreased.

In order to avoid such a problem and use the memory devices which contain defective memory cells, it is generally practiced to use a redundant construction wherein redundant memory cell columns are provided in the memory cell array. In use, a map of defective memory cells in the memory cell array is stored in a read-only memory and the like and the address signal addressing the defective memory cell in the array is converted, on the basis of the map, to an address signal which addresses a normal, defect-free memory cell. More specifically, when there is an address signal addressing a defective memory cell, the memory cell column including the defective memory cell column is switched to another, redundant memory cell column. Thereby, a normal memory cell is used in place of the addressed defective memory cell and the memory device operates as if it is a defect-free device.

Meanwhile, there is known a construction of memory device wherein the memory cell array are divided into a number of blocks each containing a number of memory cells arranged in a row and column formation. In each of the blocks, a memory cell is connected to a bit line and a divided word line which is a word line branched from a main word line.

FIG. 1 shows such a conventional semiconductor memory device having the divided word line construction.

Referring to FIG. 1, the memory cell array 1 is divided into a number of blocks or memory cell columns 2, 3, 4, . . . each containing a number of memory cells 15, 16, 17, . . . arranged therein in a row and column formation.

Commonly to the blocks 2–4, a number of word line drivers 19 each connected to a main word line MWL are provided, wherein only one word line driver 19 is illustrated in the drawing. The main word line MWL extends throughout the memory cell array 1, passing through the blocks 2–4. The word line driver 19 is supplied with a word line selection signal addressing one of the main word lines MWL from an X-decoder 24 along a bus 24a, in response to address data ADDRESS1 supplied to the X-decoder 24.

Further, there is provided a Y-decoder 25 to which a second address data ADDRESS2 is supplied, wherein the Y-decoder 25 is connected to bit line drivers 11, 12, 13, . . . via an address bus 25a for selectively addressing a pair of bit lines BL and $\overline{BL}$ via respective read/write controllers 6, 7, 8, . . . . Thus, when the address data ADDRESS1 and ADDRESS2 which address together the memory cell 15 in the block 2 has come in to the decoders 24 and 25, the bit line decoder 11 energizes the controller 6 in response to the output of the Y-decoder 25, and thereby the bit line BL and $\overline{BL}$ connected to the addressed memory cell 15 are selected. At the same time, the main word line driver 19 is energized in response to the output of the X-decoder 24 and the main word line driver 19 selects the main word line MWL connected thereto.

In the foregoing memory cell device of the divided word line construction, there is provided a gate device 20 which is supplied with the output of the main word line driver 19 and the output of the bit line driver 11 for producing an output which is supplied to the memory cell 15 via a divided word line DWL. Thus, only when the block 2 is addressed in response to the output of the bit line driver 11 of the block 2 and at the same time by the word line MWL which is addressed in response to the output of the main word line driver 19, the gate device 20 is energized and the divided word line DWL connected to the addressed memory cell 15 is selected. In the illustrated example, the bit line driver 11 and the main word line driver 19 are constructed as a NAND gate while the gate device 20 is constructed as a NOR gate. Thus, the divided word line DWL is selected in response to the low level output of the devices 11 and 19. An exactly the same construction is provided also in other blocks.

When reading data stored in the memory cell such as the memory cell 15 in the memory cell array 1, the data in the memory cell 15 is transferred along the bit lines BL and $\overline{BL}$ to the controller such as the controller 5, and from there transferred further to a sense amplifier 10a along a read bus 26. When writing data, on the other hand, the data supplied to a data input terminal DIN is transferred to to the selected controller such as the controller 6 along a write bus 27 after amplification in a write amplifier 10b, and the data is further transferred to the memory cell such as the memory cell 15 along the bit lines BL and $\overline{BL}$.

By adopting the divided word line construction in combination of the block construction of the memory cell array, the length of the word line connected to the memory cell can be reduced and thereby the access time of the memory device is significantly reduced as a result of the reduction of parasitic capacitance associated with the memory cells connected to the word line.

In such a memory device having the divided word line construction, too, the foregoing redundant construction is employed. In this case, the redundant memory cells are provided in each of the blocks 2–4 and operation of the bit line driver is controlled such that an alternative bit line or memory cell column is selected when a bit line which is connected to one or more defective memory cells is addressed. For this purpose, a read-only memory not illustrated is provided in cooperation with each of the bit line drivers 11–13.

In such a conventional memory device having the divided bit line construction and the redundant construction, there is a problem, associated with the fact that the selection of the alternative memory cell column can only be made within a same block of the memory cell array, that the redundant memory cell column or columns have to be provided in each of the blocks and thus, the proportion of the memory cells used for the redundancy purpose tends to become excessively large. In other words, there is a problem that the chip size of the memory device tends to become excessively large due to the redundant construction.

SUMMARY OF THE INVENTION

Accordingly, it is a general object of the present invention to provide a novel and useful semiconductor memory device wherein the foregoing problems are eliminated.

Another object of the present invention is to provide a semiconductor memory device having a divided word line construction and a redundant construction at the same time, wherein the efficiency of use of the memory cell for the redundancy purpose is improved and the overall chip size is reduced.

Another object of the present invention is to provide a semiconductor memory device comprising a memory cell array in which the memory cell array is divided into a number of blocks each having divided word lines and bit lines extending in the block, wherein one block in the memory cell array is used as a redundant memory cell block such that when a defective memory cell in one block is addressed, the memory cell column including the defective memory cell in the block is replaced with a memory cell column in the redundant memory cell block. According to the present invention, the redundant column is used commonly with respect to all the blocks in the memory cell array and the efficiency of use of the redundant memory cell column is significantly improved. It should be noted that the provision of redundant column in each of the blocks can be eliminated by the present construction and the size of the chip of the semiconductor memory device is significantly reduced.

Other objects and further features of the present invention will become apparent from the following detailed description when read in conjunction with the attached drawings.

DETAILED DESCRIPTION

Figure 2:
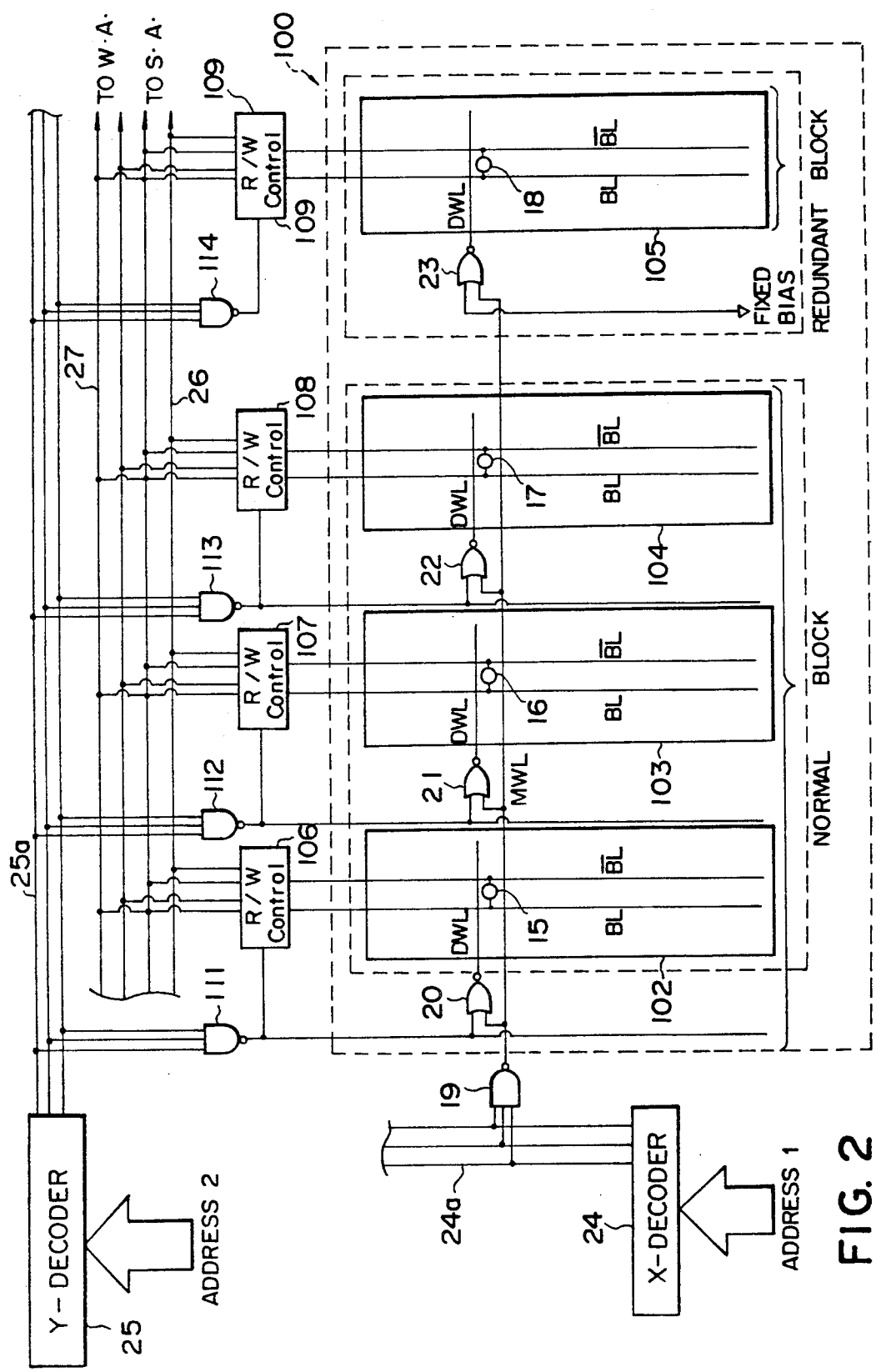
FIG. 2 is a diagram showing a first embodiment of the semiconductor memory device according to the present invention.

FIG. 2 shows a first embodiment of the semiconductor memory device of the present invention.

Figure 1:
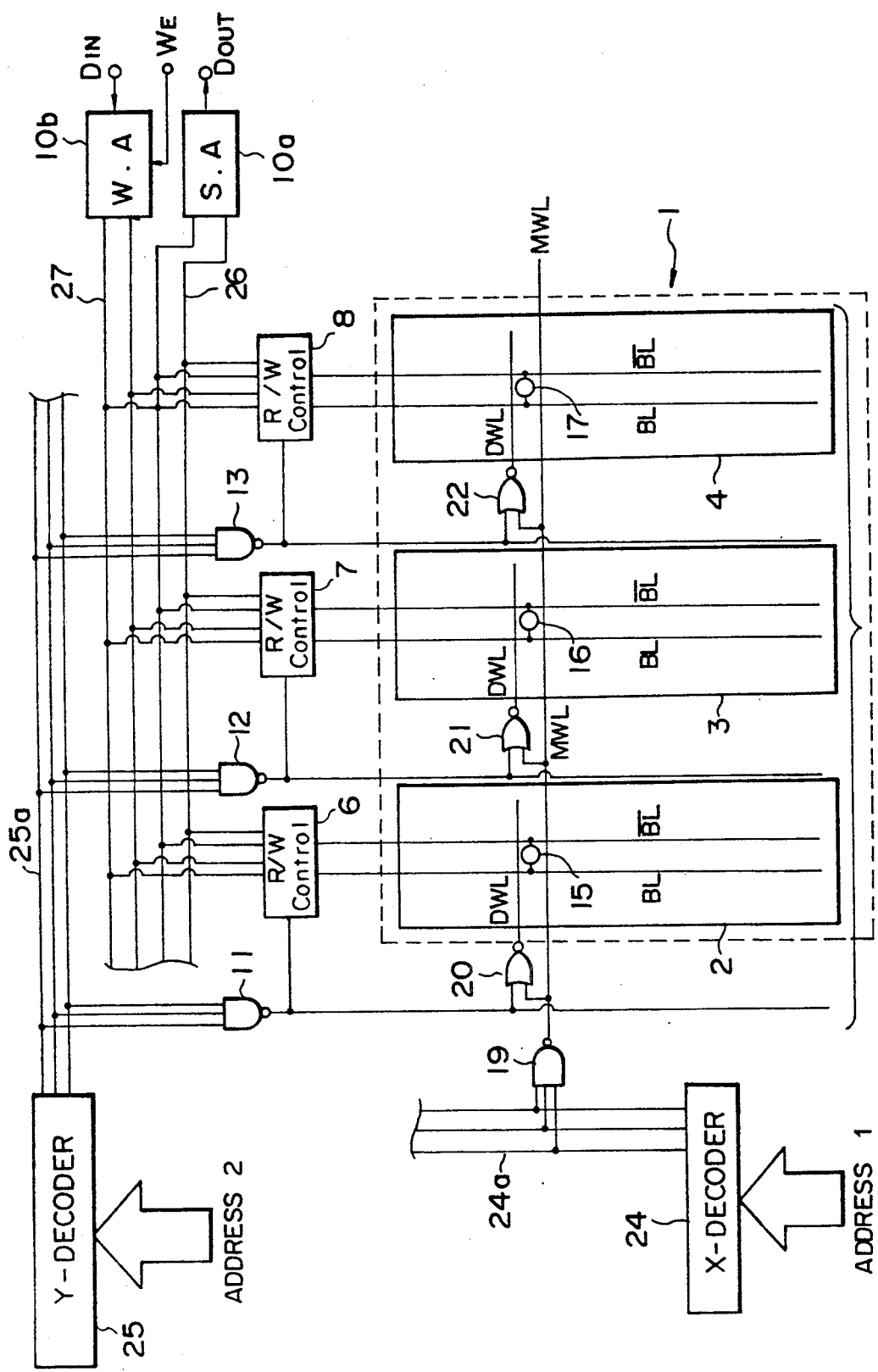
FIG. 1 is a block diagram showing a conventional semiconductor memory device.

Referring to FIG. 2, the semiconductor memory device comprises a memory cell array 100 similar to the memory cell array 1 of FIG. 1 except that each of the blocks 102-104 does not contain the redundant columns and that there is provided a redundant block 105 including a number of memory cells 18 arranged in row and column formation. This redundant block 105 is formed exclusively from memory cells forming the redundant columns.

Each of the memory cells 18 is connected, in the row direction, commonly to a divided word line DWL extending through the redundant block 105, and the divided word line DWL is connected to a main word line MWL extending throughout the memory cell array 100 via a gate device 23. In the present embodiment, the gate device 23 comprises a NOR device having a first input terminal to which the main word line MWL is connected and a second input terminal to which a negative or low level bias voltage is applied constantly.

The bit lines in the block 102 are connected to a read/write controller 106 similar to the read/write controller 6 of FIG. 1, the bit lines in the block 103 are connected to a read/write controller 107 similar to the read/write controller 7 of FIG. 1, the bit lines in the block 104 are connected to a read/write controller 108 similar to the read/write controller 8 of FIG. I, while the bit lines in the redundant block 105 are connected to a read/write controller 109 to be described later. Similarly to the conventional device, the read/write controllers 106-109 are connected to the read bus 26 and the write bus 27 which are connected respectively to the sense amplifier 10a and the write amplifier 10b. Further, bit line drivers 111, 112, !13, 114, . . . are provided respectively in correspondence to the read/write controllers 106-109 in place of the bit line drivers 11, 12, 13, . . . of FIG. 1 for addressing a bit line in response to the output signal of the Y-decoder 25 which in turn is produced in response to the column address data ADDRESS2.

The bit line drivers 111-114 are programmable logic devices for producing an output in response to the address data supplied to the Y-decoder 25 in accordance with a program stored therein. Generally, the bit line drivers 111 etc. are operated such that a read/write controller such as the read/write controller 106 connected to the bit line to which the addressed memory cell is connected, is enabled selectively in response to the address data to the Y-decoder 25, while other read/write amplifiers are disabled. In cooperation with the selection of the main word line MWL via the word line driver 19 in response to the row address data ADDRESS1 to the X-decoder 24, the addressed memory cell, for example the memory cell 15, is addressed. Thereby, the selection of the divided word line DWL connected to the memory cell 15 is made via the gate device 20 in response to the output of the word line driver 19 and the bit line driver 111.

In the case where a defective memory cell is included in the addressed memory cell column, the bit line driver 111 is prohibited from enabling the read/write controller 106 as a result of the programmed operation which takes place in accordance with the program stored therein. At the same time, one of the bit line drivers such as the bit line driver 114 cooperating with the read/write controller for the redundant block 105 is driven so as to enable a read/write controller cooperating with the bit lines in the block 105 such as the read/write controller 109, also under the control of a program stored in the driver 114. Thereby, a memory cell column in the redundant block 105 is addressed in place of the memory cell column in the block 102 and the semiconductor memory device operates as if it is a memory device free from defective memory cells.

Figure 3:
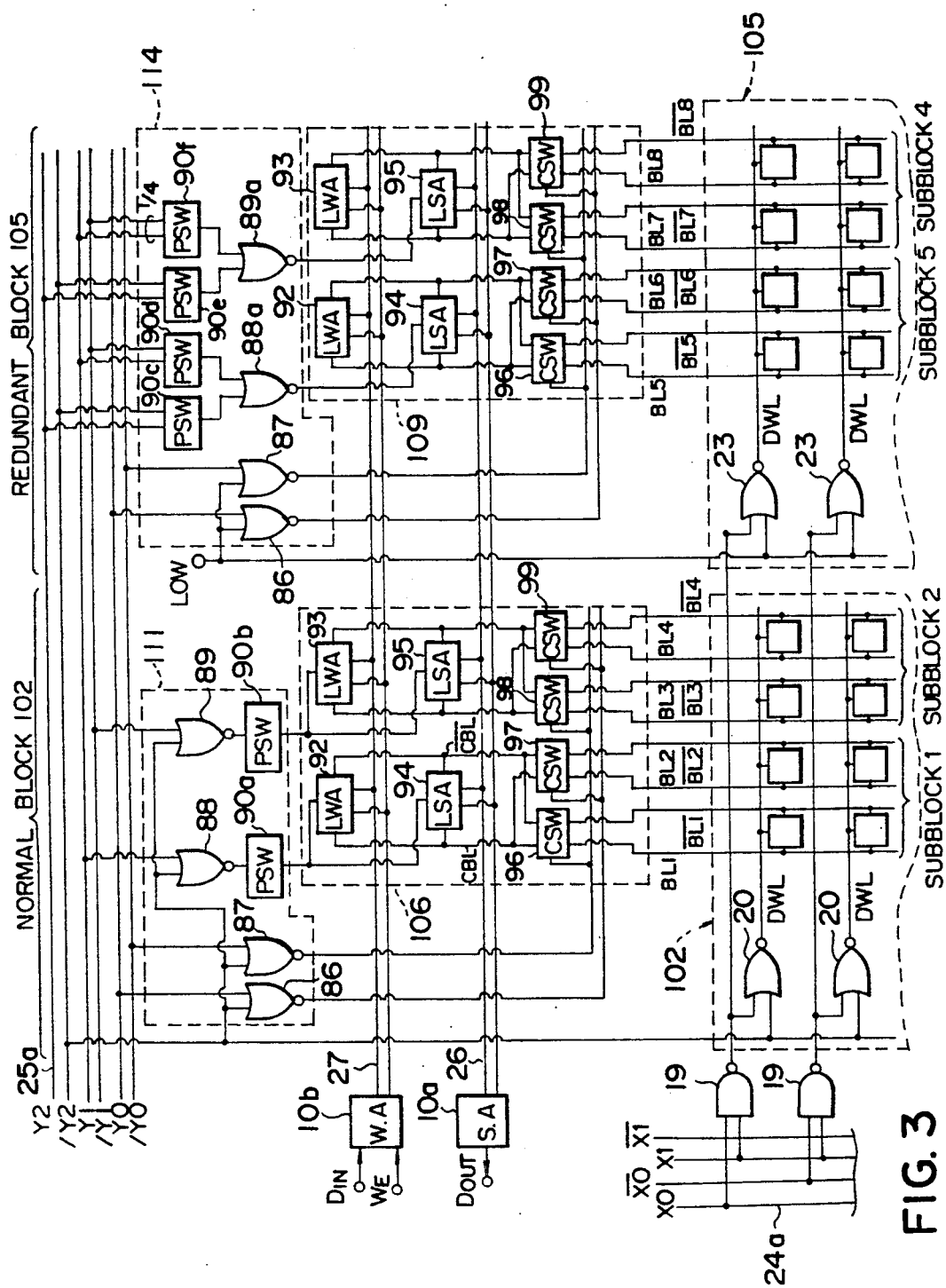
FIG. 3 is a block diagram showing a part of the semiconductor memory device of FIG. 2.

FIG. 3 shows an essential part of the semiconductor memory device of FIG. 2. For the sake of simplicity of the drawing, only a part of the block 102 and block 105 are shown together with related peripheral circuits.

First, the block 102 will be described.

Referring to FIG. 3, the address bus 25a comprises a number of line pairs respectively designated as Y0 and /Y0, Y1 and /Y1, Y2 and /Y2, . . . , and the bit line driver 111 comprises NOR gates 86–89, wherein the NOR gate 86 has a first input terminal connected to the line Y0 and a second input terminal connected to the line /Y2, the NOR gate 87 has a first input terminal connected to the line /Y0 and a second input terminal to the line /Y2, the NOR gate 88 has a first input terminal connected to the Y1 line and a second input terminal connected to the /Y2 line, and the NOR gate 89 has a first input terminal connected to the /Y1 line and a second input terminal connected to the /Y2 line. Further, the NOR gate 86 has an output terminal connected to a column switch circuit 97 to which a pair of bit lines BL2 and $\overline{BL2}$ are connected and further to a column switch circuit 99 to which a pair of bit lines BL4 and $\overline{BL4}$ are connected. Similarly, the NOR gate 87 has an output terminal connected to a column switch circuit 96 to which a pair of bit lines BL1 and $\overline{BL1}$ are connected and to a column switch circuit 98 to which a pair of bit lines BL3 and $\overline{BL3}$ are connected. To each of the column switches 96 and 97, a local write amplifier 92 and a local sense amplifier 94 are connected electrically in parallel with each other, wherein the column switch 97 connects the bit lines BL2 and $\overline{BL2}$ to the local sense amplifier 94 and the local write amplifier 92 in response to the output of the NOR gate 86. In the illustrated example, the column switch 97 is enabled when there is a low level state on both of the lines Y0 and /Y2. At the same time, the column switch circuit 99 is enabled and the bit lines BL4 and $\overline{BL4}$ are connected to the local sense amplifier 95 and the local write amplifier 93. The local sense amplifiers 94 and 95 are connected commonly to the read bus 26 while the local write amplifiers 92 and 93 are connected commonly to the write bus 27.

The local write amplifiers 92 and 93, and the local sense amplifiers 94 and 95 are driven in response to the logic state appearing on the lines /Y2, Y1, and /Y1. More specifically, a NOR gate 88 having an input terminal to the line Y1 and another input terminal connected to the line /Y2 is provided such that an output signal thereof is supplied to the local write amplifier 92 and further to the local sense amplifier 94 via a programmable switch 90a. Similarly, another NOR gate 89 having an input terminal connected to the line /Y1 and another input terminal connected to the line /Y2 is provided such that an output signal thereof is supplied to the local write amplifier 93 and further to the local sense amplifier 95 via a programmable switch 90b.

Thus, in response to the output of the programmable switch 90a, the local write amplifier 92 is enabled and transfers the logic data on the write bus 27 to the bit line pair BL1 and $\overline{BL1}$ or to the bit line pair BL2 and $\overline{BL2}$, depending on the state of the column switches 96 and 97. Thus, when the write amplifier 10b is enabled in response to a write enable signal WE supplied thereto, the data supplied to an input terminal $D_{IN}$ of the write amplifier 94 is transferred to the bit lines via the write bus 27, the local write amplifier 92 and the column switch 96 or 97. Further, in response to the output of the programmable switch 90a, the local sense amplifier 10a is enabled and transfers the logic data on the bit line pair BL1 and $\overline{BL1}$ or the bit line pair BL2 and $\overline{BL2}$ to the sense amplifier 10b along the read bus 26, depending on the state of the column switches 96 and 97. Further, the data on the read bus 26 is transferred to an output terminal $D_{OUT}$ of the sense amplifier 10a.

A similar operation takes place also in the case of the system including the local write amplifier 3, the local sense amplifier 95, the column switches 98 and 99, and the bit line pairs BL3 and $\overline{BL3}$, BL4 and $\overline{BL4}$. In this circuit part, a NOR gate 89 and a programmable switch 90b are provided respectively in correspondence to the NOR gate 88 and the programmable switch 90a described previously. As the operation of this part is substantially identical to the part including the NOR gate 88, the programmable switch 90a, the local write amplifier 92, the local sense amplifier 94, the column switches 96 and 97, and the bit line pairs BL1 and $\overline{BL1}$ and BL2 and $\overline{BL2}$ which are described already, the description thereof will not be repeated.

It should be noted that the bit lines BL1, $\overline{BL1}$, BL2 and $\overline{BL2}$ form one subblock, SUBBLOCK1, in the block of memory cell while the bit lines BL3, $\overline{BL3}$, BL4 and $\overline{BL4}$ form another subblock, SUBBLOCK2, in the same block 102. Thus, the selection of the subblock is made by the NOR gate 88 and the NOR gate 89 as well as by the cooperating programmable switches 90a and 90b in response to the data on the lines Y1 and /Y1, while the selection of the column in each subblock is made by the NOR gates 86 and 87 in response to the data on the lines Y0 and /Y0. Further, the selection of the block is made on the basis of the data on the lines Y2 and /Y2.

In the present invention, the programmable switches 90a and 90b are programmed such that the selection of the subblock is prohibited when the subblock is the one which contains a defective memory cell therein. Thus when the SUBBLOCK1 including the bit lines BL1–$\overline{BL2}$ is the subblock which includes the defective memory cell, the programmable switch 90a is programmed such that it does not produce the output which enables the local write amplifier 92 and the local sense amplifier 94. In the simplest case, the programmable switches 90a and 90b may be a fuse which is selectively blown up by a laser beam irradiation.

Next, the redundant block 105 will be described.

In the redundant block 105, too, the bit lines BL5, $\overline{BL5}$, BL6 and $\overline{BL6}$ are arranged to form a subblock, SUBBLOCK3, and the bit lines BL7, $\overline{BL7}$, BL8 and $\overline{BL8}$ an are arranged to form another subblock, SUBBLOCK4. In each of the subblocks, the local write amplifier 92 and the local sense amplifier 94 are provided similarly to the case of the block 102 together with the column switches 96 and 97 or 98 and 99. The column switches 96–99 are enabled in response to the output of the NOR gates 86 and 87 also in the similar manner with the case of the block 102, while in the present embodiment, the second input terminal of the NOR gates 86 and 87 are connected to a constant voltage source producing a negative or low level bias voltage. Thus, whenever a low level state appears on the line Y0 or /Y0, one of the column switches 96–99 are enabled in each of the subblocks.

In the present embodiment, the NOR gate 23 is always supplied with the low level output of the constant voltage source to one of the input terminals. Thus, whenever a main word line MWL is selected in response to the data on the bus 24a via a word line driver 19, a high level output is supplied from the NOR gate 23 to the conjugate divided word line DWL. Thus, when a column switch such as the column switch 96 is enabled in response to the data on the line /Y0, the bit lines BL5 and $\overline{BL5}$ are connected to the read bus 26 and to the write bus 27 via the local sense amplifier 94 and the local write amplifier 92 respectively, provided that the local write amplifier 92 and the local sense amplifier 94 are enabled.

In order to control the local write amplifier 92 and the local sense amplifier 94 in the SUBBLOCK3 of the redundant block 105, a NOR gate 88a is provided so as to supply an output signal to the local write amplifier 92 and to the local sense amplifier 94, wherein the NOR gate 88a has a first input terminal connected to the lines Y1 and /Y1 via a programmable switch 90d and a second input terminal connected to the lines Y2 and /Y2 via a programmable switch 90c. Similarly, in the SUBBLOCK4 of the redundant block 105, a NOR gate 89a is provided so as to supply an output signal to the local write amplifier 92 and to the local sense amplifier 94, wherein the NOR gate 89a has a first input terminal connected to the lines Y1 and /Y1 via a programmable switch 90f and a second input terminal connected to the lines Y2 and /Y2 via a programmable switch 90e. The programmable switches 90c-90f are constructed such that, when a subblock in one of the blocks such as the SUBBLOCK1 in the block 102 is selected in response to the data on the lines Y2, /Y2, Y1 and /Y1 on the bus 25a, one of the programmable switches such as the programmable switch 90c is energized in response to the selection of the block 102 to produce a low level output to be supplied to the NOR gate 88a, while the programmable switch 90d is energized at the same time to produce a low level output to be supplied to the NOR gate 88a. Thus, as a result of the combination of the programmable switch 90c and the programmable switch 90d, the NOR gate 88a is enabled and produces a high level output by which the local write amplifier 92 and the local sense amplifier 94 are enabled. Similarly, the programmable switches 90e and 90f are programmed in combination so as to address the subblock 4 in response to the addressing of a subblock in other block which is selected in response to the logic data on the line /Y0, Y0, /Y1, Y1, Y2 and /Y2, for example.

Figure 4A:
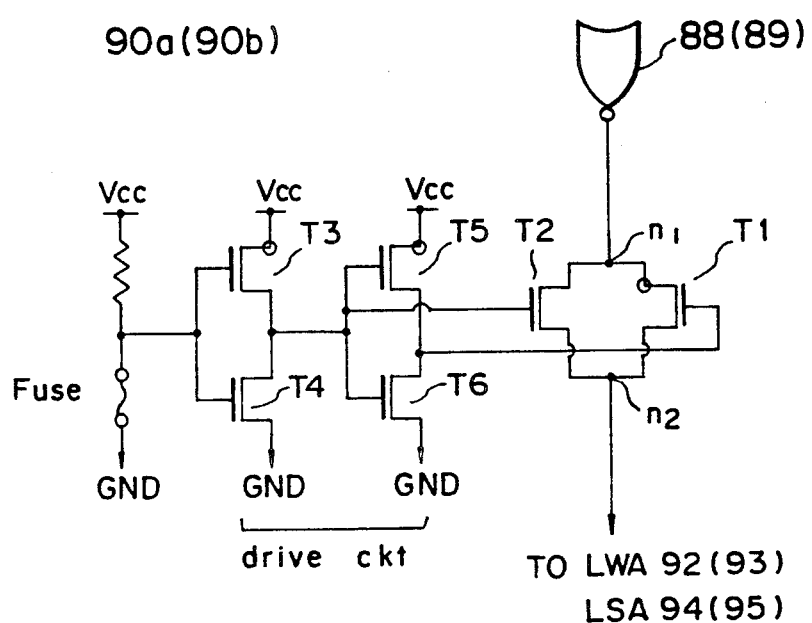
FIGS. 4A and 4B are circuit diagrams showing the construction of programm,able switches used in the semiconductor memory device of FIG. 3.

FIG. 4A shows an example of the programmable switches such as the programmable switch 90a or 90b used in the normal block 102. As can be seen from FIG. 4A, the programmable switch comprises a p-channel MOS transistor T1 and an n-channel MOS transistor T2 coupled parallel with each other at nodes n1 and n2 to form a switch triggered by a drive circuit comprising transistors T3-T6, wherein the output of the NAND circuit such as the NAND circuit 88 or 89 is supplied to the node n1, and the local write amplifier 92 or 93 and the local sense amplifier 94 or 95 are connected commonly to the node n2. The transistors T3 and T4 of the drive circuit form a first stage inverter circuit of which output is supplied to the gate of the n-channel MOS transistor T2, while the transistors T5 and T6 form a second stage inverter circuit of which output is supplied to the gate of the p-channel MOS transistor. The conduction of the transistors T1 and T2 is controlled in response to the output of the drive circuit which in turn is controlled in response to a control voltage to the gate of the transistors T3 and T4, of which the control voltage is changed in response to the existence or absence of fuse at the input side of the drive circuit. For example, when there is a fuse, the transistors T1 and T2 are conducted and the output of the NOR circuit 88 is transferred to the local write amplifier 92 and to the local sense amplifier 94, while when the fuse is blown up for example in response to irradiation of laser beam, the supply of the output of the NOR gate 88 to the local sense amplifier and the local write amplifier is prohibited. Thus, by selectively blowing up the fuse in correspondence to the defective memory cells included in the subblock, the programmable switches in the ordinary blocks can be programmed such that the addressing of the subblock cooperating therewith is prohibited.

Figure 4B:
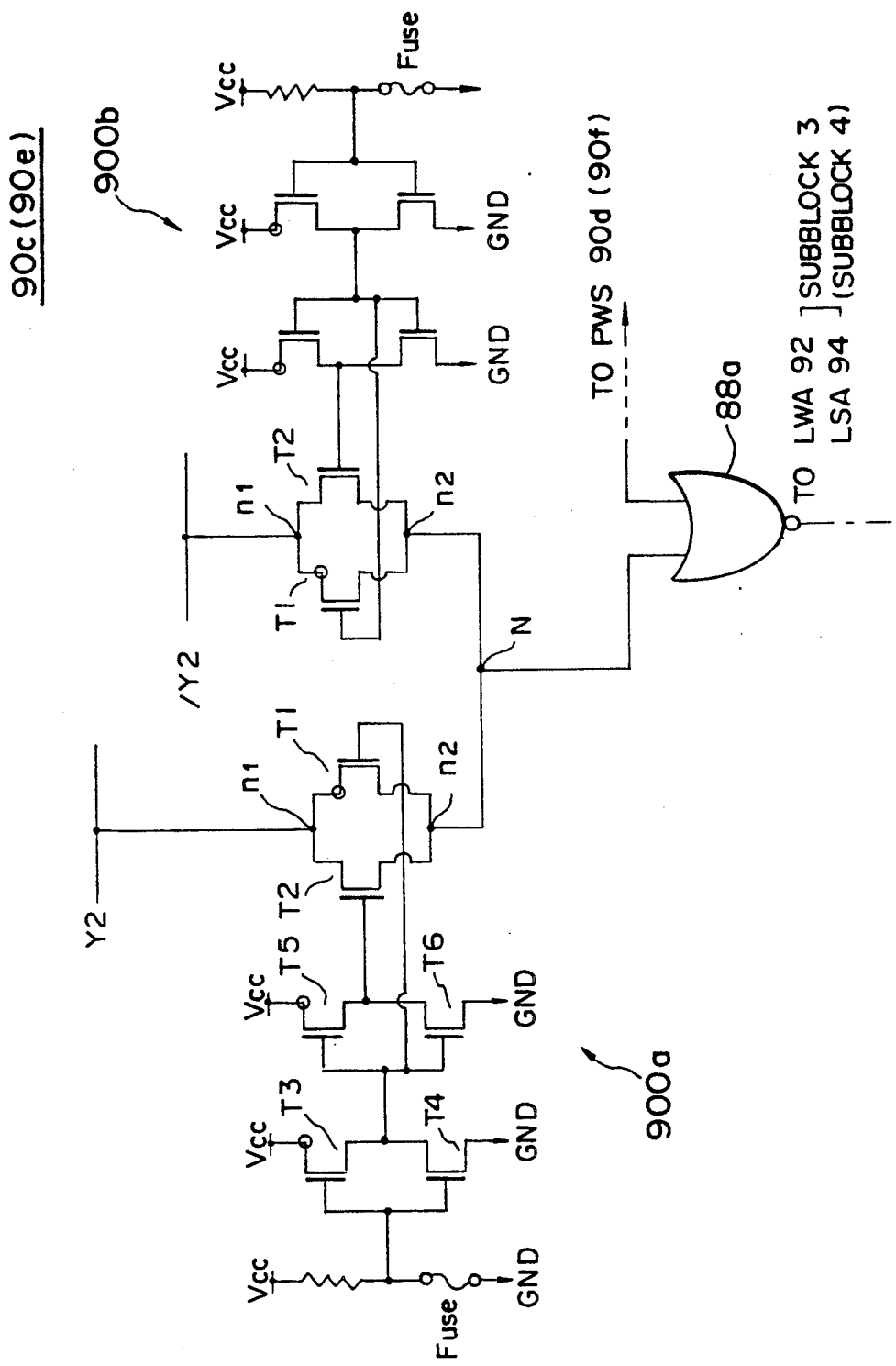

FIG. 4B shows a construction of the programmable switch such as the switches 90c or 90e used in the redundant block 105, wherein a circuit part 900a, constructed almost identical to the circuit shown in FIG. 4A except that the output of the second stage inverter circuit is supplied to the gate of the n-channel MOS transistor T2 and that the output of the first stage inverter circuit is supplied to the gate of the p-channel MOS transistor T1, is connected to a circuit part 900b which is identical in construction to the circuit 900a at a node N. In the circuit of FIG. 4B, the node n1 connecting the transistors T1 and T2 is connected commonly to the line Y2 or /Y2 depending on whether the illustrated circuit is the programmable switch 90c or 90d, and the node N, connecting the nodes n2 of the circuit 900a and 900b, is connected to one of the input terminals of the NOR circuit 88a. Similarly, another programmable switch 90d or 90f having an identical construction is provided such that the programmable switch is connected to the line Y1 or /Y1 and to the other input terminal of the NOR gate 88a.

In the circuit of FIG. 4B, it is possible to program such that the NOR gate 88a produces an output selectively in response to a particular combination of the input data to the lines Y1, /Y1, Y2 and /Y2 of the bus 25a by selectively blowing up the fuse. For example, the foregoing operation of selecting the SUBBLOCK3 in place of the SUBBLOCK 1 may be achieved by selectively blowing up the fuse of the circuit 90a and at the same time the fuse of the circuit 90c. When there is no fuse blown up, switching to the redundant block 105 does not occur.

Figure 5A:
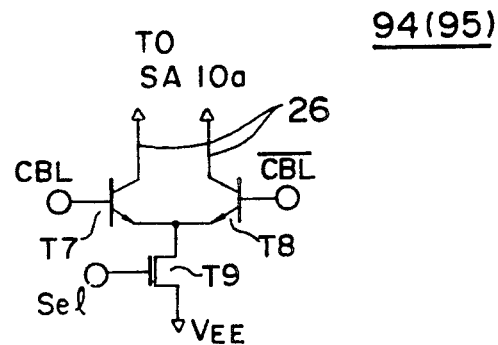
FIGS. 5A-5C are circuit diagrams showing various circuit elements used in the semiconductor memory device of FIG. 3.

FIG. 5A shows an example of the circuit used for the local sense amplifier 94 or 95. The circuit comprises a pair of bipolar transistors T7 and T8 having an emitter connected commonly to a voltage source via a MOS transistor T9, wherein the collector of respective bipolar transistors is connected to the sense amplifier 10a via the read bus 26. The transistor T7 and T8 have respective bases which are connected to a bit line CBL and a bit line $\overline{CBL}$ which are the bit line parts located outside of the memory cell array 100. The local sense amplifier is enabled or disabled in response to a control signal supplied to the gate of the MOS transistor T9. As the operation of the sense amplifier is well known, further description thereof will be omitted.

Figure 5B:
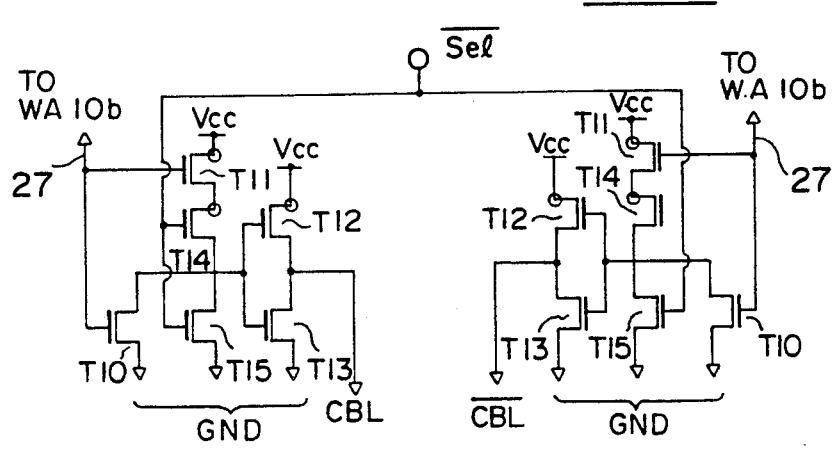

FIG. 5B shows an example of the circuit used for the local write amplifier 92 or 93. The circuit comprises MOS transistors T10-T13 for amplifying a data signal supplied from the write amplifier 10b via the write bus 27 and another MOS transistors T14 and T15 for enabling or disabling the circuit in response to a control signal /Sel supplied thereto from a programmable switch such as the switch 90a. When the local write amplifier is enabled, the data from the write amplifier 10b is outputted at the node between the transistor T12 and T13 to the bit line part CBL or $\overline{CBL}$ after amplification. As the construction and operation of this circuit is well known, further description thereof will be omitted.

Figure 5C:
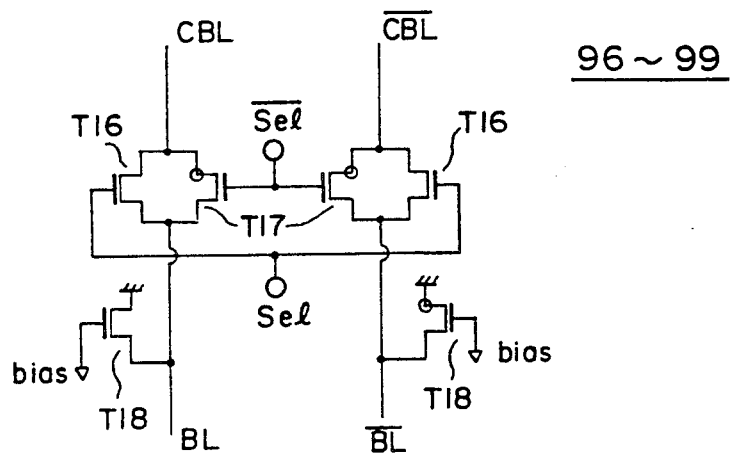

FIG. 5C shows an example of the circuit used for the column switches 96–99. The circuit comprises a pair of MOS transistors T16 and T17 coupled each other to form a switch between the bit line BL or $\overline{BL}$ and the bit line CBL and $\overline{CBL}$, wherein the switch is activated in response to a control signal /Sel and an inversion thereof, Sel, supplied thereto from a programmable switch such as the switch 90a. Further, there is a transistor T18 connected to each of the bit lines, which transistor T18 is usually turned off under suitable biasing not illustrated. As the construction and operation of this circuit is well known, further description will be omitted.

Figure 6:
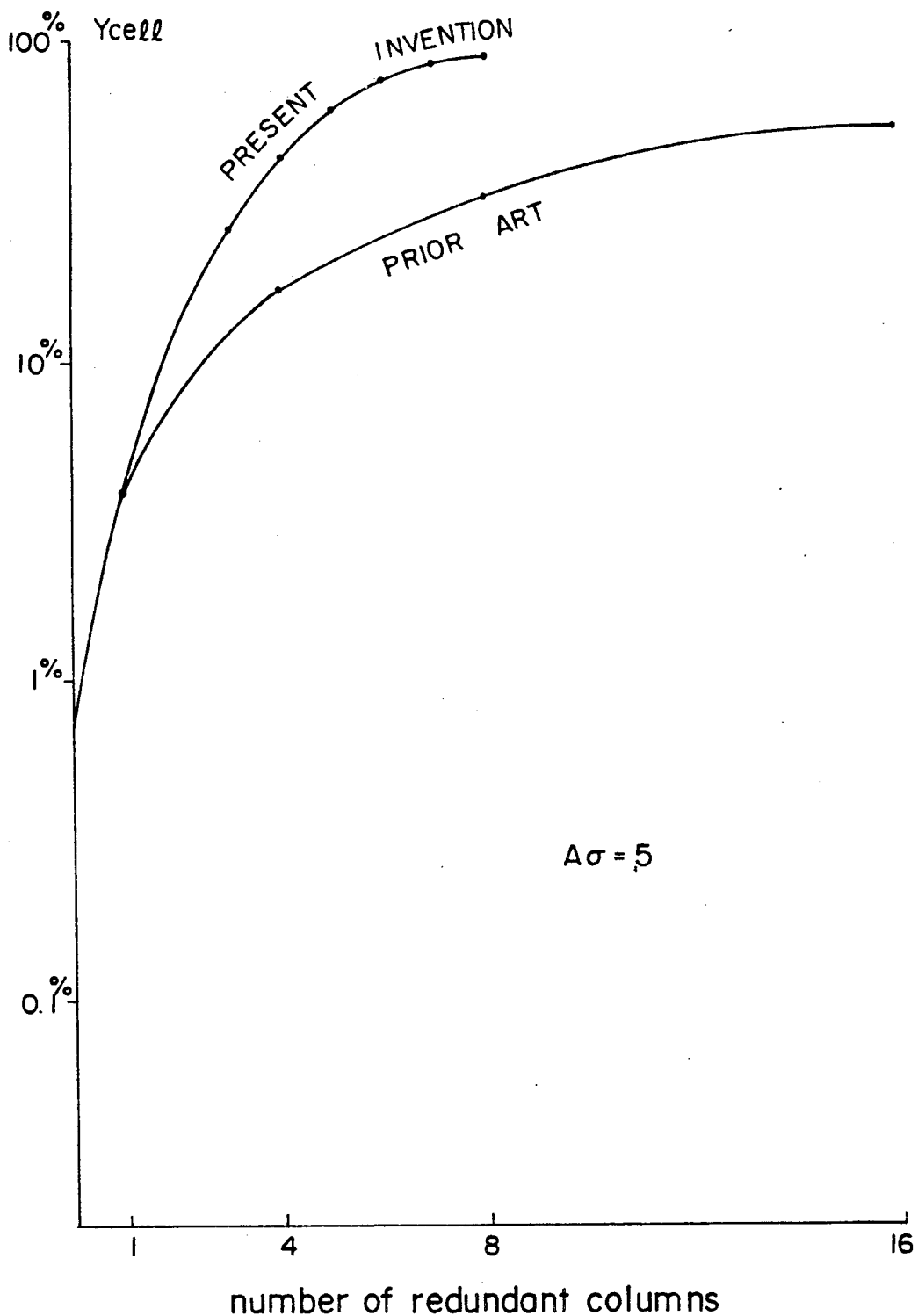
FIG. 6 is a graph showing the effect of the present invention.

FIG. 6 is a graph showing the effect achieved by the present invention wherein the improvement in the yield achieved by the present invention is illustrated.

In general, the yield Y of the semiconductor memory device at the time of fabrication is represented by the following equation.

$$U = Y_{cell} \times Y_{PER}$$

wherein $Y_{cell}$ stands for the yield of the cell and $Y_{PER}$ stands for the yield of the peripheral circuits. In the following, only the parameter $Y_{cell}$ will be considered.

In the case of the memory cell array having the divided word line construction including n blocks therein, the yield $Y_{cell}$ is represented as $$Y_{cell} = (Y_{BLOCK})^n$$

In terms of the defect density $\delta$ or number of defective cells in a unit area, the yield $Y_{cell}$ can be represented as $$Y_{cell} = \exp(-A\delta)$$

where A stands for the area of the memory cell.

In the case of the prior art memory device wherein in average one defect is remedied within one block by selecting a redundant column in the same block, the yield $Y_{BLOCK}$ improved by the redundant construction is represented as $$Y_{BLOCK} = \exp(-A\delta/n) + A\delta/n \cdot \exp(-A\delta/n).$$

Thereby, the yield of the memory cell as a whole is given as $$Y_{cell} = (Y_{BLOCK})^n = (1 + A\delta/n)^n \exp(-A\delta) \quad (1)$$

When, on the other hand, the defect in the memory cell array is remedied in the cell array as a whole as in the case of the present invention, the yield $Y_{cell}$ is represented as $$\begin{aligned}
Y_{cell} &= \exp(-A\delta) + A \cdot \exp(-A\delta) + (A\delta)^2/2! \cdot \exp(-A\delta) + \\
&\quad \ldots + (A\delta)^m/m! \cdot \exp(-A\delta) \\
&= [1 + A\delta + (A\delta)^2/2! + \ldots + (A\delta)^m/m!] \cdot \exp(-A\delta)
\end{aligned} \quad (2)$$

wherein it is assumed that there are m defects in the memory cell array as a whole.

FIG. 6 shows the curves corresponding to Eq.(1) and Eq.(2) in comparison for the case of a relatively large size chip which satisfies a relation $A\delta = 5$. In FIG. 6, the abscissa represents the parameter n or m in Eqs.(1) and (2) which in turn corresponds to the number of redundant columns used in the memory cell array as a whole. As can be seen clearly from FIG. 6, a high yield can be achieved with reduced number of columns in the case of the present invention. In other words, the efficiency in the use of the redundant columns is improved in the memory device of the present invention.

Figure 7:
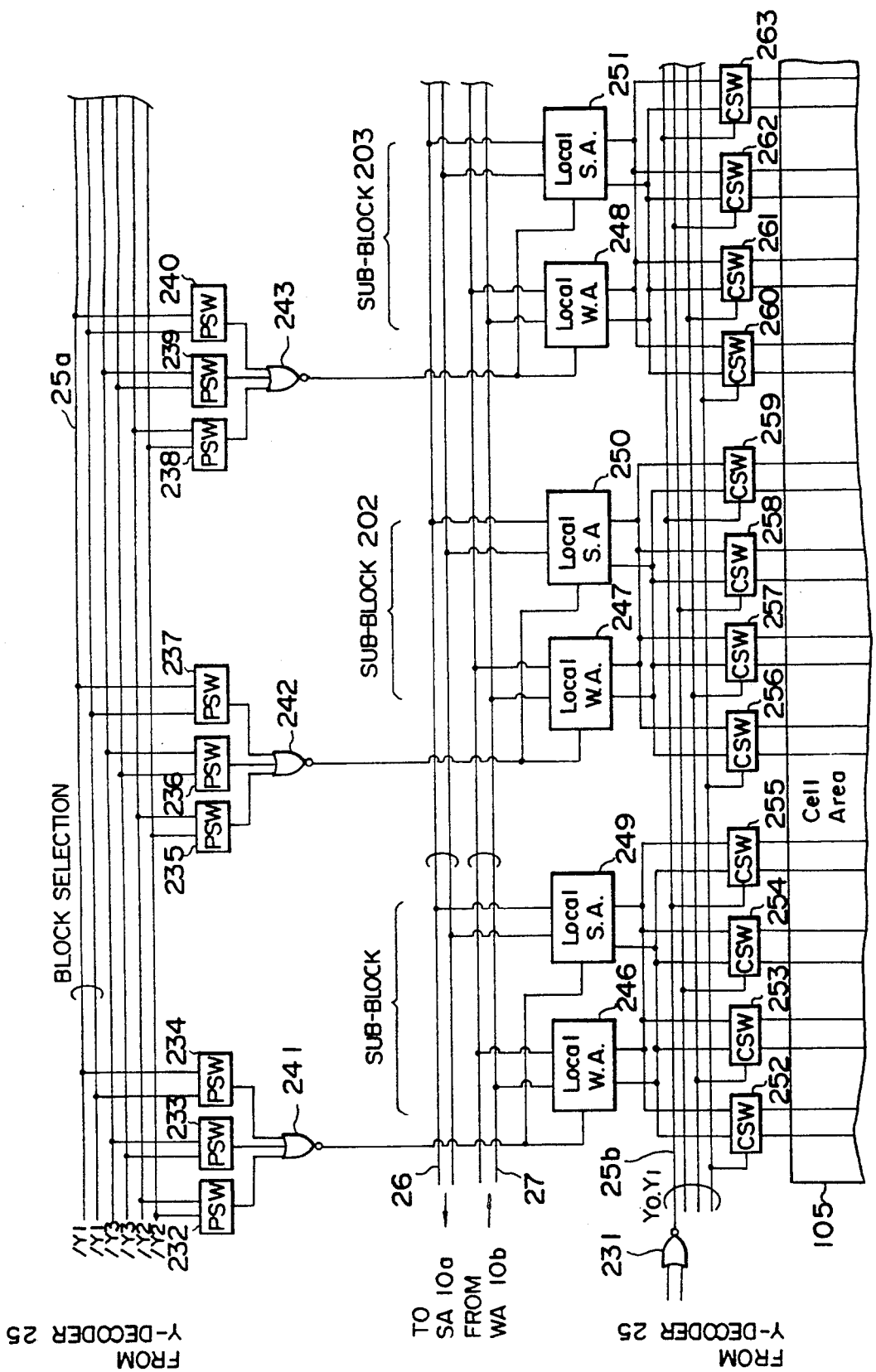
FIG. 7 is a circuit diagram showing a second embodiment of the present invention.

FIG. 7 shows a second embodiment of the semiconductor memory device of the present invention.

In the present embodiment, the address bus 25a driven by the Y-decoder 25 comprises lines Y2, /Y2, Y3, Y3, Y4 and /Y4, and programmable switches 232–240 each having a construction identical to that of the programmable switches 90c–90f of the first embodiment are connected to the address bus 25a. Thereby, the switches 232, 233 and 234 corresponding to a subblock 201 are connected as a group to the line pairs Y2 and Y2, Y3 and /Y3, and Y4 and /Y4 respectively, the output signals of these programmable switches are supplied to a NOR gate 241 corresponding to the NOR gate 88a or 89a of the first embodiment, and a local write amplifier 246 and a local sense amplifier 249, respectively corresponding to the local write amplifier 92 or 93 and the local sense amplifier 94 or 95 of the first embodiment are enabled in response to the output of the NOR gate 241.

In the present embodiment, another address bus 25b is provided as a part of the address bus 25a such that the address bus 25b is connected to the Y-decoder 25 via a NOR circuit 231 and the like, wherein the address bus 25b includes lines Y1, /Y1, Y2 and /Y2 for selecting a column in each subblock by selectively enabling column switches 252, 253, 254 and 255.

The column switches 252 and the like have a construction identical to that of the column switches used in the first embodiment, wherein there are provided four column switches in each subblock in the present embodiment and the column switches are enabled selectively in response to the logic state appearing on the line pairs Y0 and /Y0, and Y1 and /Y1. The programmable switches 232–234 are programmed so as to select the subblock 201 in response to a particular combination of the logic states on the bus 25a. A similar construction applies also to other subblocks 202, 203, etc. and the description thereof will be omitted.

Figure 8:
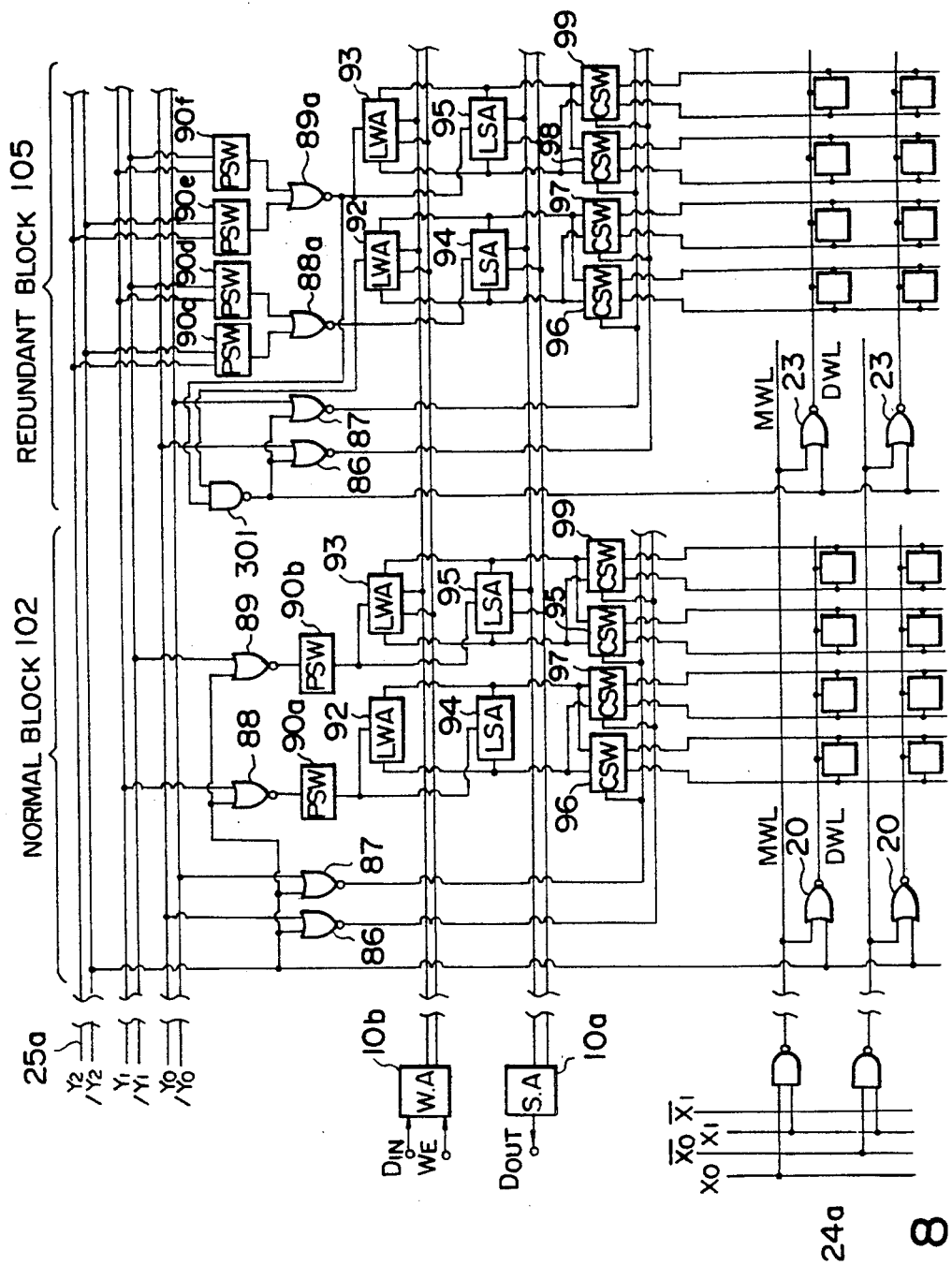
FIG. 8 is a circuit diagram showing a third embodiment of the present invention.

FIG. 8 shows a third embodiment of the present invention. In FIG. 8, the parts corresponding to those parts in FIG. 3 are represented with identical reference numerals and the description thereof will be omitted.

In contrast to the foregoing first and second embodiments, the present embodiment employs a construction wherein the divided word line DWL is not always selected by the low voltage applied to one of the input terminals of the NOR gate 23 for selecting the divided word line DWL but instead energized in response to the logic state appearing on the bus 25a, particularly the line pairs Y1 and /Y1, and Y2 and /Y2.

For this purpose, there is provided a NAND gate 301 so as to be supplied with the outputs from the NOR gate 88a and the NOR gate 89a, and thereby the NAND gate 301 produces an output enabling the NOR gate 23 in accordance with the program stored or set in the programmable switches 90c–90f. Further, the NOR gates 86 and 87 are enabled in response to the output of the NAND gate 301.

In the present embodiment, the divided word line of the redundant block is selected only when the redundant cell column is selected. Other operation is identical to the case of the first embodiment and further description of the present embodiment will be omitted.

Figure 9:
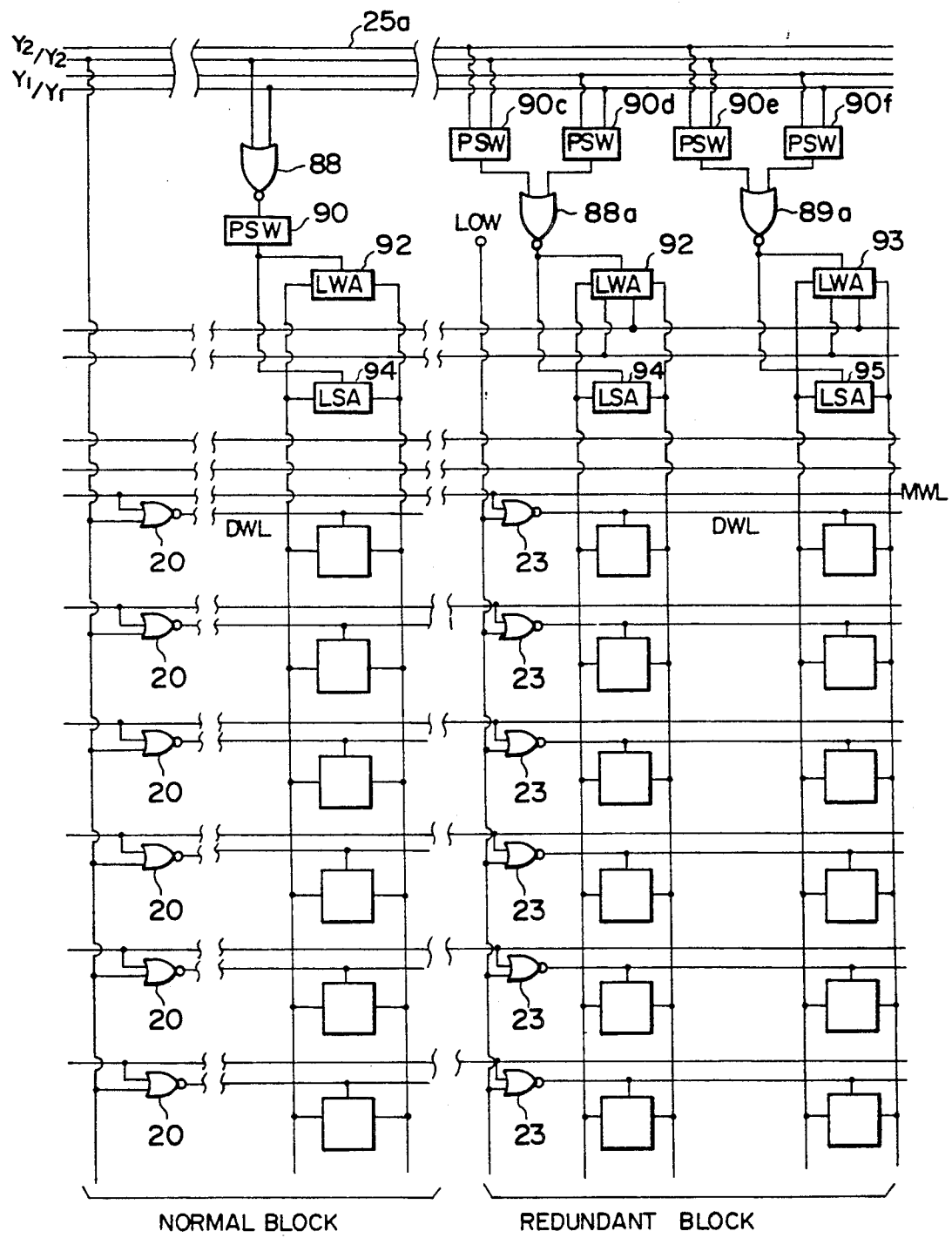
FIG. 9 is a circuit diagram showing a fourth embodiment of the present invention.

FIG. 9 shows a fourth embodiment of the present invention, wherein the division of each block into the subblocks is eliminated. In the drawing, these parts constructed identically to those corresponding parts described already with reference to FIG. 3 will be given identical reference numerals and the description thereof will be omitted.

In association with the elimination of the subblock construction, the column switches for selecting the columns within each subblock are eliminated. As the construction and operation of the present invention is apparent from the previous description with regard to the first through third embodiments, further description thereof will be omitted. It should be noted that the present invention is by no means limited to the memory cells wherein the blocks are divided into a number of subblocks.

Further, the present invention is not limited to those embodiments described heretofore but various variations and modification may be made without departing from the scope of the invention.

What is claimed is:

1. A semiconductor memory device, comprising:
   a plurality of main memory cell arrays wherein a number of memory cells for storing data are arranged in row and column formation in each of the main memory cell arrays;
   a redundant memory cell array wherein a number of memory cells for storing data are arranged in row and column formation;
   a plurality of first word lines provided in each of the plurality of main memory cell arrays so as to extend throughout the main memory cell arrays in correspondence to a group of memory cells aligned in the main memory cell arrays in a row direction;
   a plurality of second word lines provided in the redundant memory cell array so as to extend throughout the redundant memory cell array in correspondence to a group of memory cells aligned in the redundant memory cell array in the row direction;
   a plurality of first bit lines provided in each of the plurality of main memory cell arrays so as to extend throughout the main memory cell arrays in correspondence to a group of memory cells aligned in the main memory cell arrays in a column direction;
   a plurality of second bit lines provided in the redundant memory cell array so as to extend throughout the redundant memory cell array in correspondence to a group of memory cells aligned in the redundant memory cell array in the column direction;
   a plurality of common word lines extending throughout the plurality of main memory cell arrays and the redundant memory cell array, each of the common word line corresponding to one of the first word lines in each of the main memory cell arrays and one of the second word lines in the redundant memory cell array;
   row addressing means supplied with first address data addressing a first group of memory cells aligned in the row direction in one of the main memory cell arrays, said row addressing means being connected to the plurality of common word lines for addressing one of the common word lines corresponding to the addressed first group of memory cells in response to the first address data supplied thereto by supplying a selection signal to the selected common word line;
   a plurality of switching means provided in correspondence to the plurality of main memory cell arrays so as to be connected to the plurality of common word lines in each of the main memory cell arrays, said plurality of switching means being provided such that, in each of the main memory cell arrays, the switching means selectively connects one of the common word lines, on which the selection signal is supplied from the row addressing means, to a corresponding word line in response to a control signal addressing one of the main memory cell arrays for addressing the word line in the addressed main memory cell, said plurality of switching means being provided further in correspondence to the redundant memory cell array such that, in the redundant memory cell array, the switching means selectively connects the common word line, on which the selection signal is supplied from the row addressing means, to a corresponding word line of the redundant memory cell, thereby addressing the word line;
   column addressing means supplied with second address data for addressing one of the main memory cell arrays and a second group of memory cells aligned in the column direction in the addressed main memory cell array, said column addressing means addressing the addressed main memory cell by producing a first control signal supplied to the switching means in response to the second address data supplied thereto and further addressing one of the bit lines corresponding to the addressed second group of memory cells in the addressed memory cell array by producing a second control signal in response to the second address data supplied thereto, said first address data and said second address data defining an addressed memory cell as a memory cell included commonly in the first group and second group of the memory cells, said column addressing means comprising first programmable means for selectively prohibiting the addressing of the main memory cell and the bit line therein by suppressing the second control signal when predetermined second address data, addressing a bit line which is connected to a defective memory cell, is supplied to the column addressing means;
   redundant column addressing means supplied with the second address data addressing one of the main memory cell and a second group of memory cells aligned in the column direction in the addressed main memory cell array, for addressing one of the bit lines in the redundant memory cell array in response to the second address data supplied thereto, said redundant column addressing means having second programmable means for enabling the addressing of the bit line in the redundant memory cell array only when predetermined second address data is supplied to the redundant column addressing means by producing a third control signal;

data reading means connected to the bit lines of the main memory cell arrays and the bit lines of the redundant memory cell array for reading data stored in the addressed memory cell in a main memory cell array in response to the second control signal supplied thereto from the column addressing means and for reading data stored in a redundant memory cell in the redundant memory cell array in response to the third control signal supplied thereto from the redundant column addressing means; and data writing means connected to the bit lines of the main memory cell arrays and to the bit lines of the redundant memory cell array for writing data into the addressed memory cell in a main memory cell array in response to the second control signal supplied thereto from the column addressing means and for writing data in a redundant memory cell in the redundant memory cell array in response to the third control signal supplied thereto from the second programmable means of the redundant column addressing means.

2. A semiconductor memory device as claimed in claim 1 in which the data reading means comprises a plurality of sense amplifiers provided in correspondence to the main memory cell arrays and in correspondence to the redundant memory cell array such that, in each of the main memory cell arrays, a plurality of sense amplifiers are connected to corresponding bit lines, and in the redundant memory cell array, a plurality of sense amplifiers are connected to corresponding bit lines, said plurality of sense amplifiers provided in correspondence to the main memory cell arrays being activated in response to the second control signal supplied thereto from the column addressing means for reading data on the bit line connected thereto, said plurality of sense amplifiers provided in correspondence to the redundant memory cell array being turned on in response to the third control signal from the second programmable means in the redundant column addressing means for reading data on the bit line connected thereto.

3. A semiconductor memory device as claimed in claim 2 in which each of said plurality of sense amplifiers in the main memory cell arrays is provided in correspondence to a plurality of bit lines including a predetermined number of bit lines forming a subblock of memory cell column in the main memory cell array, each of said plurality of sense amplifiers in the redundant memory cell array is provided in correspondence to a plurality of bit lines including said predetermined number of bit lines forming a subblock of redundant memory cell column in the redundant memory cell array, and there is provided column selection means in correspondence to each of the subblocks of memory cell column in the main memory cell arrays and in correspondence to each of the subblocks of redundant memory cell column in the redundant memory cell column, said column selection means being provided with the second address data for selectively connecting one bit line in the subblock to the sense amplifier corresponding to the subblock.

4. A semiconductor memory device as claimed in claim 1 in which the data writing means comprises a plurality of write amplifiers provided in correspondence to the main memory cell arrays and in correspondence to the redundant memory cell array such that, in each of the main memory cell arrays, a plurality of write amplifiers are connected to corresponding bit lines, and in the redundant memory cell array, a plurality of write amplifiers are connected to corresponding bit lines, said plurality of write amplifiers provided in correspondence to the main memory cell arrays being activated in response to the second control signal supplied thereto from the column addressing means for transferring data supplied thereto to the bit line connected thereto, said plurality of write amplifiers provided in correspondence to the redundant memory ell array being turned on in response to the third control signal from the second programmable means in the redundant column addressing means for transferring data supplied thereto to the bit line connected thereto.

5. A semiconductor memory device as claimed in claim 4 in which each of said plurality of write amplifiers in the main memory cell arrays is provided in correspondence to a plurality of bit lines including a predetermined number of bit lines forming a subblock of memory cell column in the main memory cell array, each of said plurality of write amplifiers in the redundant memory cell array is provided in correspondence to a plurality of bit lines including said predetermined number of bit lines forming a subblock of redundant memory cell column in the redundant memory cell array, and there is provided column selection means in correspondence to each of the subblocks of memory cell column in the main memory cell arrays and in correspondence to each of the subblocks of redundant memory cell column in the redundant memory cell array, said column selection means being provided with the second address data for selectively connecting one bit line in the subblock to the write amplifier corresponding to the subblock.

6. A semiconductor memory device as claimed in claim 1 in which said plurality of switching means provided in correspondence to the redundant memory cell array is controlled such that the selection signal on the common word line is transferred to the word line of the redundant memory cell array corresponding to the common word line, whenever the selection signal is supplied to the common word line.

7. A semiconductor memory device as claimed in claim 6 in which said switching means comprises a logic gate device having a first input terminal connected to the common word line, an output terminal connected to the word line and a second input terminal connected to a bias voltage source such that a signal supplied to the first input terminal is transferred to the output terminal thereof.

8. A semiconductor memory device as claimed in claim 6 in which said switching means comprises a logic gate device having a first input terminal connected to the common word line, an output terminal connected to the word line, and a second input terminal, wherein there is provided control means having an output terminal connected to the second input terminal of the logic gate device, said control means being supplied with the second address data for producing a signal to be supplied to the second input terminal such that the transfer of the selection signal on the common word line to the corresponding word line via the logic gate device is achieved in response to the second address data.

* * * * *